(12) United States Patent
Ewe et al.

(10) Patent No.: US 9,059,083 B2
(45) Date of Patent: Jun. 16, 2015

(54) SEMICONDUCTOR DEVICE

(75) Inventors: Henrik Ewe, Burglengenfeld (DE);
Joachim Mahler, Regensburg (DE);
Manfred Mengel, Bad Abbach (DE);
Reimund Engl, Regensburg (DE); Josef Hoeglauer, Munich (DE); Jochen Dangelmaier, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 637 days.

(21) Appl. No.: 11/855,712

(22) Filed: Sep. 14, 2007

(65) Prior Publication Data

US 2009/0072379 A1    Mar. 19, 2009

(51) Int. Cl.
*H01L 23/12*        (2006.01)
*H01L 23/00*        (2006.01)
(Continued)

(52) U.S. Cl.
CPC ............ *H01L 24/25* (2013.01); *H01L 21/4821* (2013.01); *H01L 21/6835* (2013.01); *H01L 23/3107* (2013.01); *H01L 23/49524* (2013.01); *H01L 23/49562* (2013.01); *H01L 23/49575* (2013.01); *H01L 24/24* (2013.01); *H01L 24/82* (2013.01); *H01L 2221/68345* (2013.01); *H01L 2224/24011* (2013.01); *H01L 2224/2402* (2013.01); *H01L 2224/24051* (2013.01); *H01L 2224/24137* (2013.01); *H01L 2224/24226* (2013.01); *H01L 2224/32245* (2013.01); *H01L 2224/76155* (2013.01); *H01L 2224/82001* (2013.01); *H01L 2224/82039* (2013.01); *H01L 2924/01013* (2013.01); *H01L 2924/01015* (2013.01); *H01L 2924/01018* (2013.01); *H01L 2924/01029* (2013.01); *H01L 2924/0103* (2013.01); *H01L 2924/01033* (2013.01); *H01L 2924/01046* (2013.01); *H01L 2924/01047* (2013.01); *H01L 2924/01078* (2013.01); *H01L 2924/01082* (2013.01); *H01L 2924/12044* (2013.01); *H01L 2924/14* (2013.01); *H01L 2924/19043* (2013.01); *H01L 2924/01005* (2013.01); *H01L 2924/01006* (2013.01); *H01L 2924/01068* (2013.01); *H01L 2224/73267* (2013.01); *H01L 2224/82102* (2013.01);
(Continued)

(58) Field of Classification Search
CPC ................. H01L 2224/48247; H01L 2924/00; H01L 23/49575
USPC .................. 257/675–728, E21.418, E21.499, 257/E29.257; 438/259
See application file for complete search history.

(56) References Cited

U.S. PATENT DOCUMENTS 5,637,922 A * 6/1997 Fillion et al. ................... 257/728
6,396,127 B1 * 5/2002 Munoz et al. ................. 257/666
(Continued)

FOREIGN PATENT DOCUMENTS

DE      19755398    9/1998
DE      10335153    3/2005
(Continued)

*Primary Examiner* — Eugene Lee
*Assistant Examiner* — Fang-Xing Jiang
(74) *Attorney, Agent, or Firm* — Dicke, Billig & Czaja, PLLC

(57) ABSTRACT

A semiconductor device is disclosed. One embodiment includes a carrier, a semiconductor chip attached to the carrier, a first conducting line having a first thickness and being deposited over the semiconductor chip and the carrier and a second conducting line having a second thickness and being deposited over the semiconductor chip and the carrier. The first thickness is smaller than the second thickness.

10 Claims, 8 Drawing Sheets

(51) Int. Cl.
  *H01L 21/48*    (2006.01)
  *H01L 21/683*   (2006.01)
  *H01L 23/31*    (2006.01)
  *H01L 23/495*   (2006.01)

(52) U.S. Cl.
  CPC ............. *H01L2224/24145* (2013.01); *H01L 2224/24246* (2013.01); *H01L 2224/32145* (2013.01); *H01L 2225/06568* (2013.01); *H01L 2924/12032* (2013.01)

(56) References Cited

U.S. PATENT DOCUMENTS

| | | | |
|---|---|---|---|
| 6,653,691 B2* | 11/2003 | Baliga | 257/390 |
| 6,743,696 B2 | 6/2004 | Jeung et al. | |
| 7,800,217 B2 | 9/2010 | Otremba et al. | |
| 8,138,587 B2* | 3/2012 | Otremba | 257/676 |
| 2004/0080028 A1* | 4/2004 | Yanagisawa | 257/675 |
| 2006/0055011 A1* | 3/2006 | Carney et al. | 257/676 |
| 2006/0086449 A1 | 4/2006 | Nakayama | |
| 2006/0267135 A1* | 11/2006 | Wolfgang et al. | 257/528 |
| 2008/0001244 A1 | 1/2008 | Schwarzbauer | |
| 2010/0297810 A1* | 11/2010 | Otremba et al. | 438/107 |

FOREIGN PATENT DOCUMENTS

| | | |
|---|---|---|
| DE | 102004009296 | 9/2005 |
| DE | 102004033647 | 11/2005 |
| DE | 10 2006 021 959 | 11/2007 |
| WO | 2004077548 | 9/2004 |
| WO | 2005087497 | 9/2005 |
| WO | 2006084509 | 8/2006 |

* cited by examiner

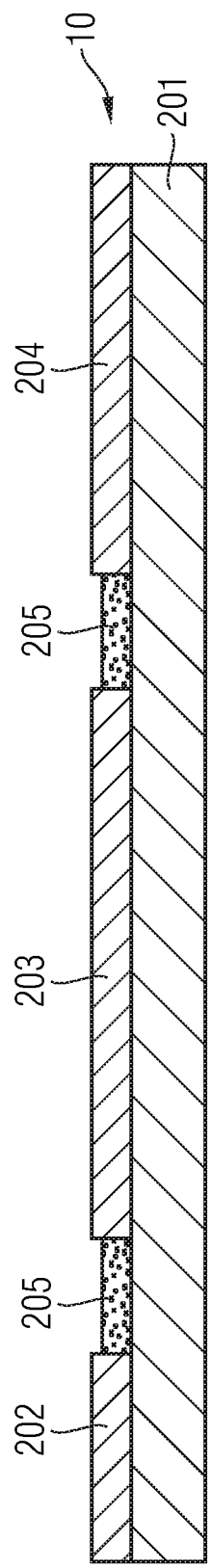
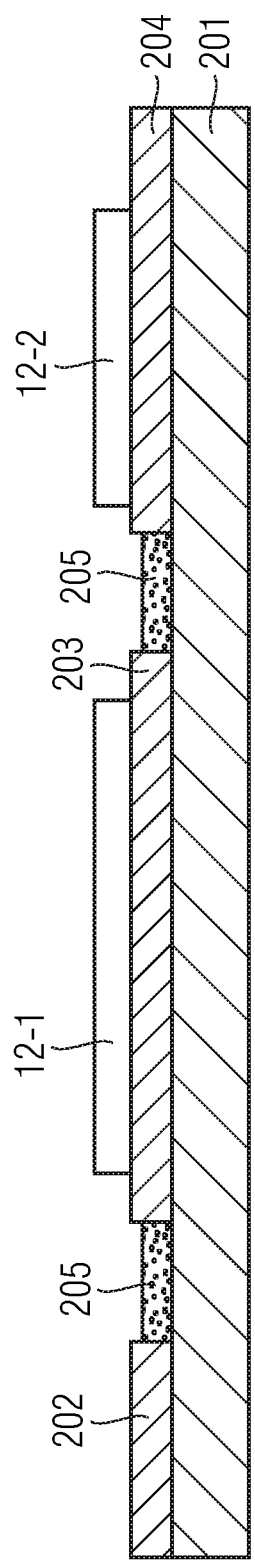

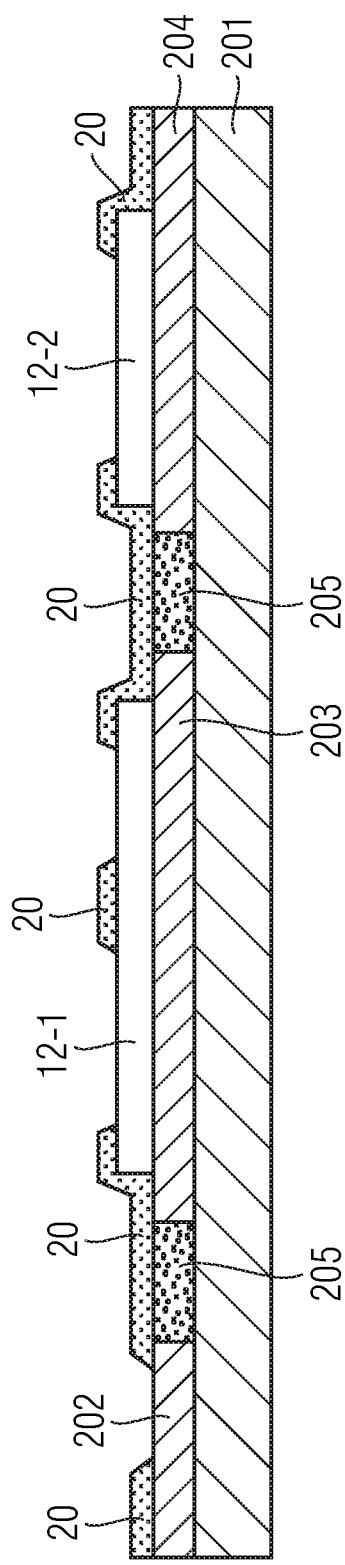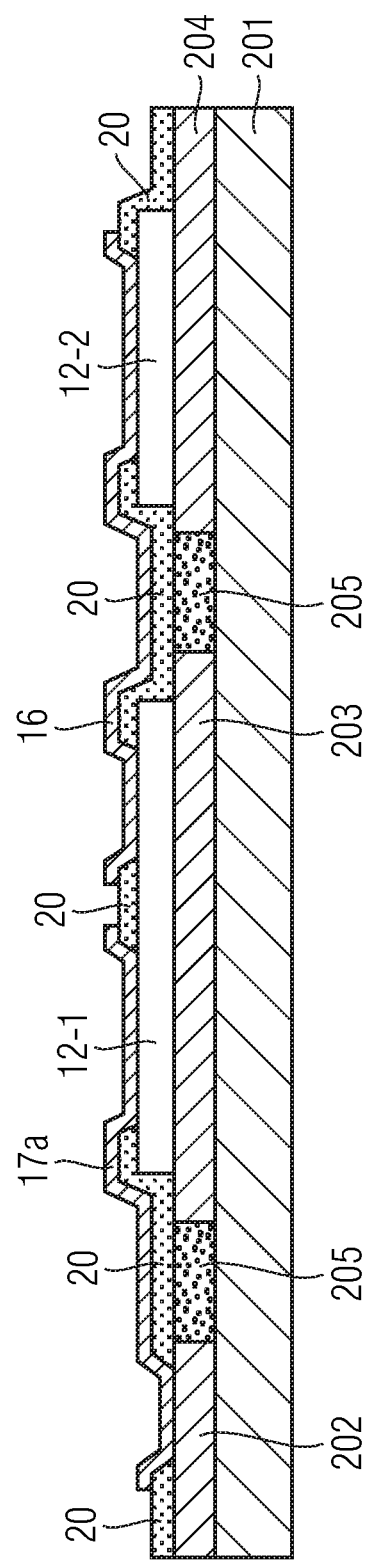

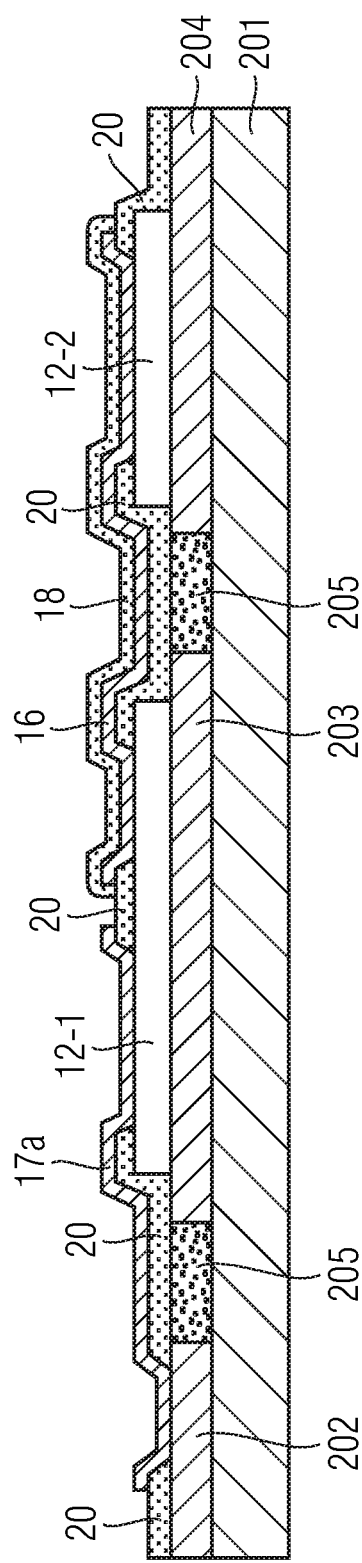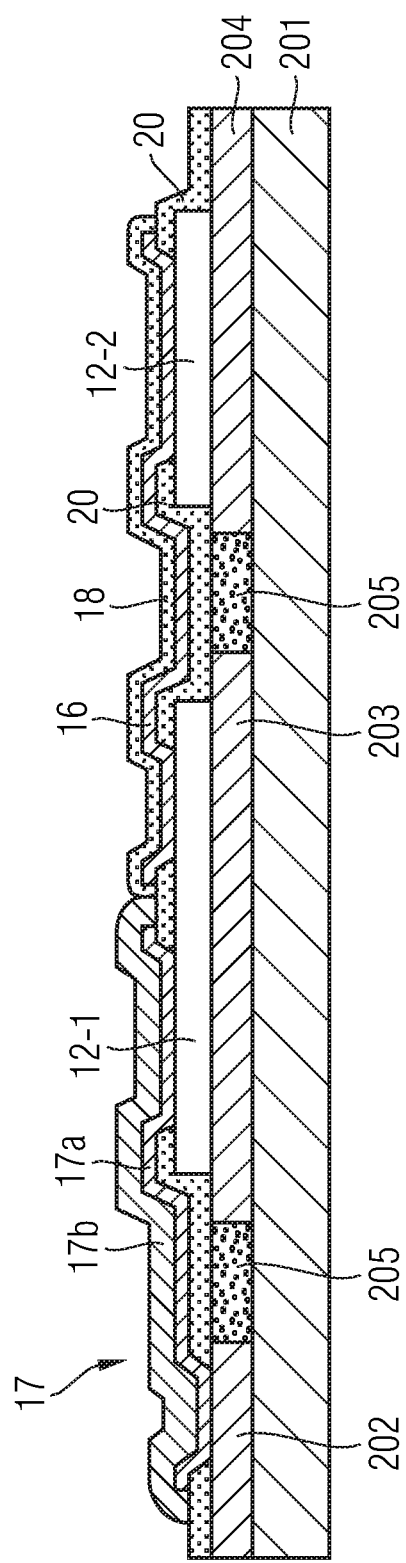

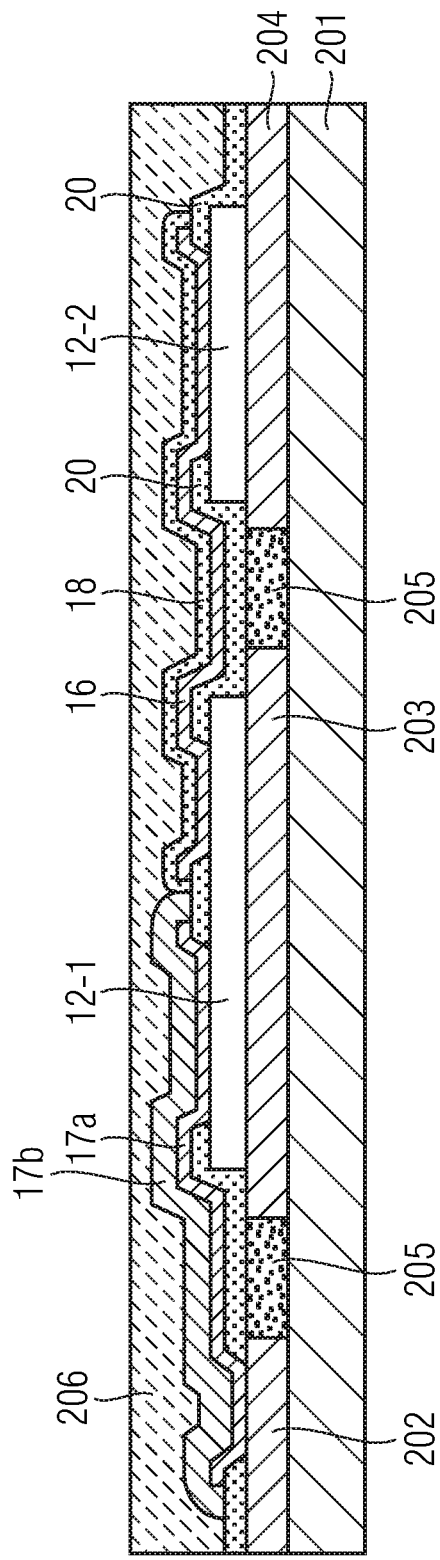
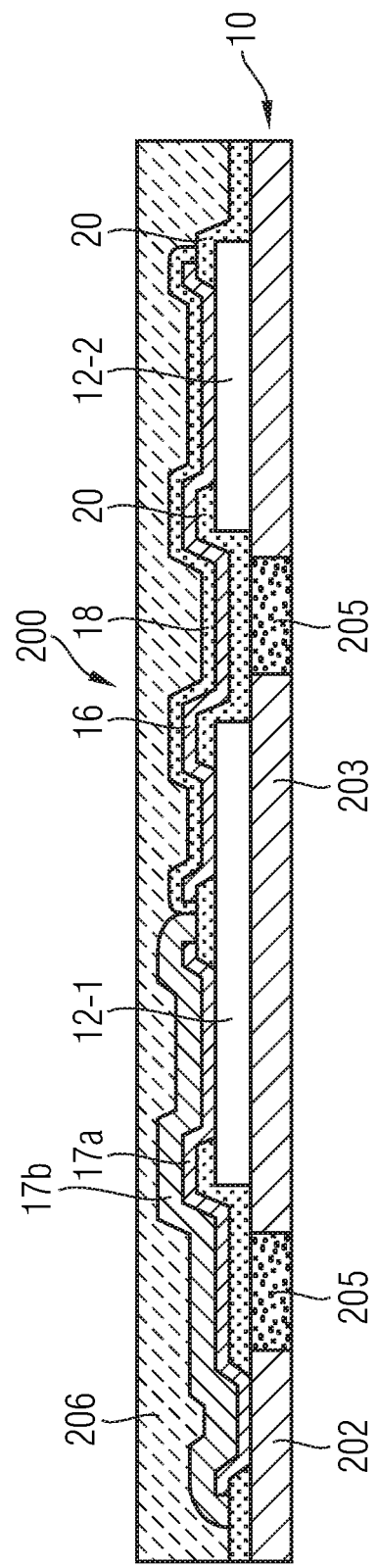

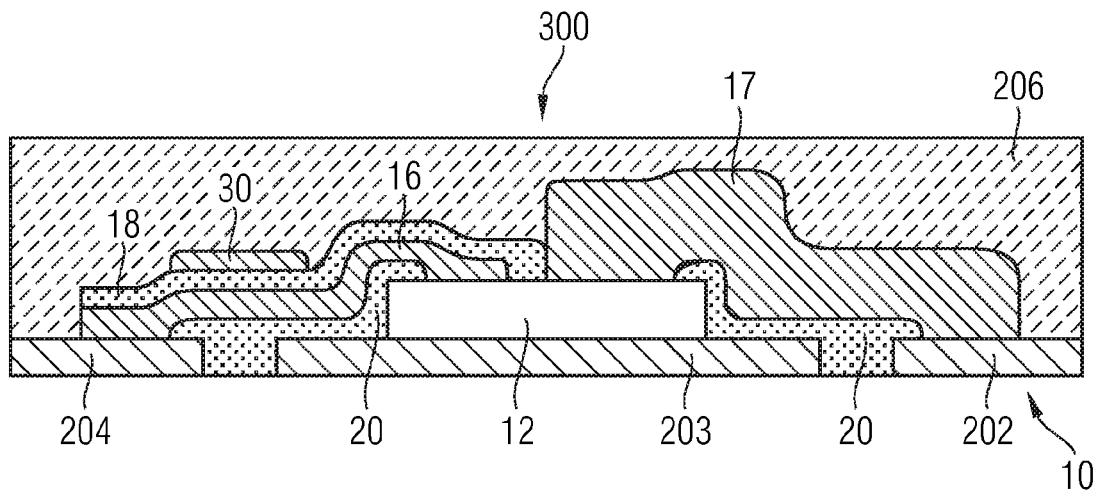
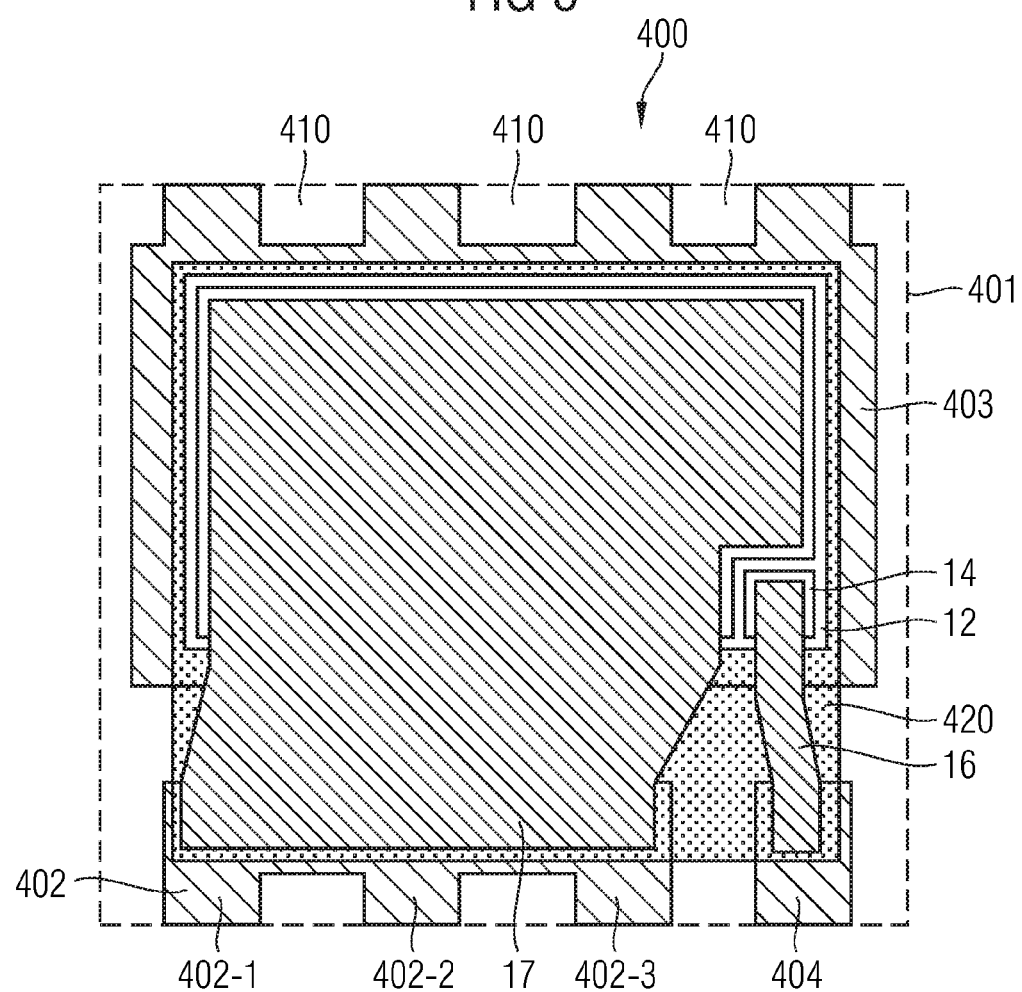

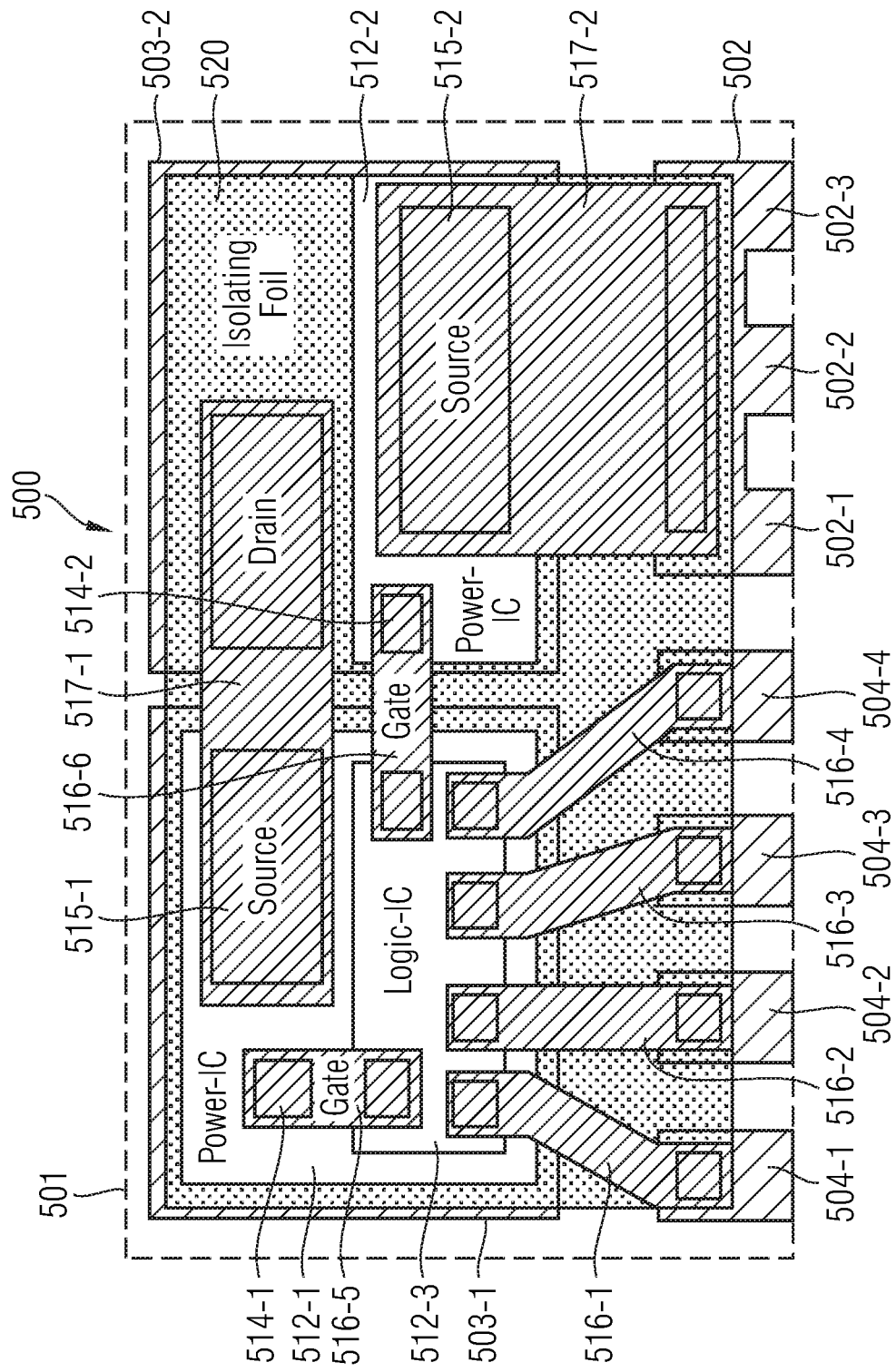

SEMICONDUCTOR DEVICE

BACKGROUND

The invention relates to a semiconductor device, and in one embodiment semiconductor device conducting lines in a package including a semiconductor chip.

Recently, planar interconnect technologies, in which conducting lines are deposited on a support structure, became increasingly attractive for various reasons, amongst them their potential to provide for small package design and low manufacturing costs.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A through 4H illustrate cross-sectional views of a semiconductor device according to a second exemplary embodiment illustrating processes in a method of fabrication the same.

FIG. 5 illustrates a schematic cross-sectional view of a semiconductor device according to a third exemplary embodiment.

FIG. 6 illustrates a schematic plan view of a semiconductor device according to a fourth exemplary embodiment.

FIG. 7 illustrates a plan view of a semiconductor device according to a fifth exemplary embodiment.

DETAILED DESCRIPTION

Figure 1:
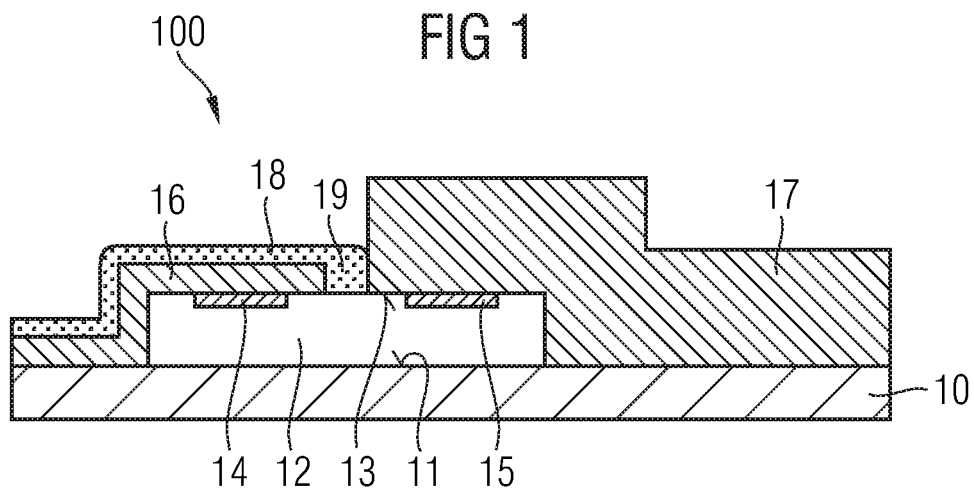
FIG. 1 illustrates a schematic cross-sectional view of a semiconductor device according to a first exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Semiconductor devices having one or more semiconductor chips attached to a carrier are described herein. The carrier may generally be of any type or material. The carrier may be, for example, a (metal) leadframe or a part of a leadframe, such as a die pad. Other types of carriers such as laminate substrates or carriers made of ceramic material are also possible. The meaning of the term "carrier" is to be interpreted in a broad sense, in particular also including carriers used in leadless packages, in which e.g., a sacrificial carrier support structure is removed during the manufacturing process, leaving die pads and/or interconnect pads remain as a carrier within the meaning of this term as used in this application. Further, an unstructured carrier (for instance a metal layer) could be used and structured at a later stage of the manufacturing process, e.g., after the application of the conductive lines or after overmolding the device.

The semiconductor chips described below may be of various types and may include, for example, integrated electrical, electro-optical or electromechanical circuits. The semiconductor chips may be, for example, configured as power transistors, power diodes, control circuits or microprocessors. In particular, semiconductor chips having a vertical structure may be involved, i.e. the semiconductor chips may be fabricated in such a way that electric current flows in a direction perpendicular to the main surfaces of the semiconductor chips. A semiconductor chip having a vertical structure may have contact elements in particular on its two main surfaces, that is to say on its top side and bottom side. In particular, power transistors and power diodes may have a vertical structure. For instance, the source contact terminal and gate contact terminal of a power transistor and the anode contact terminal of a power diode may be situated on one main surface, while the drain contact terminal of the power transistor and the cathode contact terminal of the power diode are arranged on the other main surface. A power diode may be embodied in particular as a Schottky diode. Furthermore, the semiconductor devices described below may include two or more integrated circuits, e.g., one integrated circuit of a power component and one integrated circuit configured to control the integrated circuit of the power component.

The semiconductor devices described below include conductive connection elements which are made of conducting lines deposited over a support structure. Such conducting lines deposited over a support structure may represent all or only part of the conductive connection elements used in the semiconductor device. They may extend e.g., between a chip contact of the semiconductor chip and the carrier or a chip contact of a second semiconductor chip. Furthermore, the connection elements may be thermally conductive and may serve as heat sinks for dissipating the heat generated by the semiconductor chip. It is to be noted that the conductive connection elements such as conducting lines may be designed in a variety of different shapes and sizes, for example, as a sheet-like, strip-like, ribbon-like, linear or curved conductive element. It may further be composed of one or more than one conductive materials, for instance a first metal forming a base part of the conducting line and a second metal being disposed on the first metal base part of the conducting line.

The semiconductor devices may include a mold material covering at least parts of the components of the semiconductor device. The mold material may be of any appropriate thermoplastic or thermosetting material. Various techniques may be employed to cover the components with the mold material, for example, compression molding or injection molding.

FIG. 1 illustrates a semiconductor device 100 in cross-section as a first exemplary embodiment. The semiconductor device 100 includes a carrier 10, which has a top surface 11. A semiconductor chip 12 is mounted on the top surface 11 of the carrier 10. The semiconductor chip 12 has a top surface 13 which faces away from the carrier 10.

The semiconductor chip 12 has a first chip contact 14 and a second chip contact 15 provided at the top surface 13 of the semiconductor chip 12. In case the semiconductor chip 12 is a vertical power transistor, the first chip contact 14 may be a gate contact and the second chip contact 15 may be a source contact of the power transistor.

The first chip contact 14 is electrically coupled to a first conducting line 16 and the second chip contact 15 is electrically coupled to a second conducting line 17. The thickness of the second conducting line 17, which is measured in a direction perpendicular to the carrier 10, is considerably larger than the thickness of the first conducting line 16. For instance, the thickness of the first conducting line 16 may be less than 10 µm or even less than 5 µm, whereas the thickness of the second conducting line 17 may be greater than 50 µm or even be greater than 100 µm or 150 µm.

The first conducting line 16 is covered by an insulating layer 18. The insulating layer 18 may also fill a gap 19 between the first conducting line 16 and the second conducting line 17 in order to prevent any possible short circuit between these two lines.

The first and second conducting lines 16, 17 are each deposited above the semiconductor chip 12 and above the carrier 10. Insulating layers (not illustrated) between the first and second conducting lines 16, 17 and the semiconductor chip 12 or between the first and second conducting lines 16, 17 and the carrier 10 may be provided. More specifically, the first and second conducting lines 16, 17 may be separated from the top surface 11 and the side faces of the semiconductor chip 12 by an insulating layer (not illustrated), e.g., a hard passivation layer made for instance of silicon oxide or silicon nitride or any other insulating layer such as a polymer layer as referred to by reference sign 20 in FIG. 4C. With regard to the carrier 10, no insulating layer is needed if the carrier 10 is made of an insulating material such as e.g., a laminate substrate, a PCP (Printed Circuit Board) or a ceramic substrate. Otherwise, if the carrier 10 is made of a conductive material such as e.g., a metal, the first and second conducting lines 16, 17 are separated from the carrier 10 by an intermediate insulating layer (for instance polymer layer 20 illustrated in FIG. 4C). The carrier 10, in this case, may be a leadframe or may include a metal chip pad made of a leadframe such as, for instance, used in TSLP (Thin Small Leadless Package) which will be described in more detail further below. In other words, the carrier 10 may be made of a single part as illustrated in FIG. 1 or may be composed of a plurality of parts. For instance, as will be described in more detail in the following, the carrier 10 may be composed of a chip pad and a number of conducting posts separated from the chip pad and configured to support the conducting lines 16, 17 in a region outside the outline of the semiconductor chip 12.

Figure 2:
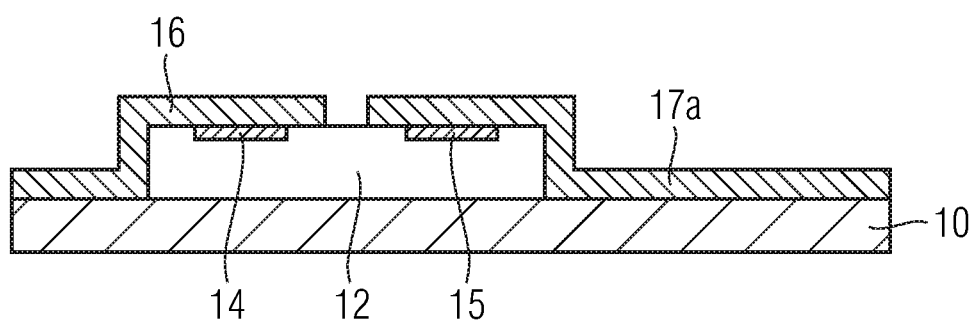
FIG. 2 illustrates a schematic cross-sectional view of the semiconductor device illustrated in FIG. 1 at a first process in a method of manufacturing the same.
Figure 3:
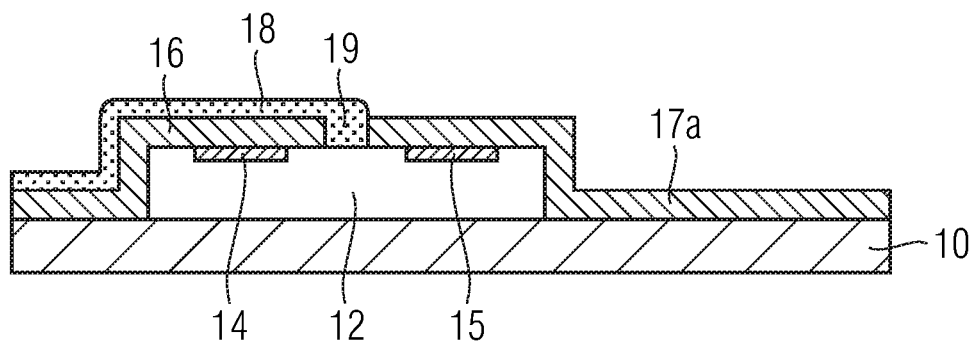
FIG. 3 illustrates a schematic cross-sectional view of the semiconductor device illustrated in FIG. 1 at a second process in a method of manufacturing the same.

FIGS. 2 and 3 illustrate one fabrication process of the semiconductor device 100. According to FIG. 2, the semiconductor chip 12 is mounted onto the carrier 10 e.g., by soldering or by any other bonding method such as adhesive bonding using an electrically conductive adhesive. If the semiconductor chip 12 is a vertical semiconductor device, an electrical contact between the carrier 10 (which may be e.g., fabricated from a metal such as copper, iron, nickel or aluminum or a metal alloy or another electrically conductive material) is provided that way. Then, the first conducting line 16 and a base part 17a of the second conducting line 17 are deposited onto the semiconductor chip 12 and the carrier 10. As already mentioned, any type of insulation may be employed to prevent electrical contact between the semiconductor chip 12 and the conducting lines 16, 17a as well as between the carrier 10 and the conducting lines 16, 17a, respectively.

The first conducting line 16 and the base part 17a of the second conducting line 17 may be deposited in the same fabrication process. According to a first embodiment, the first conducting line 16 and the base part 17a of the second conducting line 17 may be deposited by a substantially additive process such as e.g., printing or dispensing. Printing may be carried out as a stencil print process, a screen print process or an ink-jet printing process. In a stencil print process or screen print process, the desired position and shape of the conducting line 16 and the base part 17a of the conducting line 17 are mapped to form openings of the stencil (or screen) through which a conductive ink is applied. In ink-jet printing, an ink-jet nozzle is used to discharge conductive ink to form the first conducting line 16 and the base part 17a of the second conducting line 17. The conductive ink may contain particles of metal. The electrically conducting structures 16, 17a thus produced typically have a thickness of up to a few µm.

Another method for manufacturing the conducting structures 16, 17a is a dispense process in which conductive ink is applied through a capillary tool onto the semiconductor chip 12 and the carrier 10. Dispensing processes also allow for generating conducting lines having a thickness of up to a few µm.

Printing or dispensing processes as mentioned above allow to generate fine structures down to a lateral width of 10 µm or even less. The fineness of the printed or dispensed structures may be controlled by properties of the ink (e.g., viscosity), characteristics of the printing/dispensing process (e.g., the droplet size in an ink-jet process) and other physical parameters such as the temperature of the surface to be printed on.

After printing or dispensing, the metal particles in the ink are transferred into a crystalline state by sintering. Sintering of the ink may be carried out in a furnace at a temperature of about 200° C. or by a laser treatment process. During sintering, the metal particles in the ink grow together and an electrically conductive connection is produced. Metal particles may, for example, be made of gold or silver.

Prior to the printing or dispensing process, the surfaces on which deposition is made may be treated by a wet-chemical process or a plasma cleaning method. Further, in order to improve the adhesion of the first conducting line 16 and the base part 17a of the second conducting line 17, an undercoating (not illustrated) may be applied to the surface to be subjected to the printing or deposition process. For instance, a thin gold layer of a few nanometers may be deposited e.g., by a sputtering process or a chemical vapor deposition process onto these surfaces. Gold layers are known to have a high adhesion on polymers and, on the other hand, provide for a high adhesion to silver or gold particles as may be present in the conductive ink. Such undercoating may be removed at a later stage of the fabrication process by e.g., applying an etching method, wherein the conducting lines 16, 17 are used as a mask.

In one embodiment, a very thin layer of organic material may be applied on the surfaces used as the platform for the printing and/or dispensing process. Such an organic layer may also act as an adhesive undercoating. It may have a thickness of one or a few monolayers and thus does not effect the electrical conductivity between the first and second chip contacts 14, 15 and the first and second conducting lines 16, 17a, respectively. The organic material may, for instance, be produced from silane or from titanate.

Further, the adhesion of the first conducting lines 16 and the base part 17a of the second conducting line 17 on the surfaces on which they are applied may be improved by a metal oxide layer. Such metal oxide layer may be applied prior to the printing and/or dispensing process, e.g., by pyrolytic deposition of a ceramic-type layer which may have a thickness of a few nm up to a few μm. Such metal oxide layer, e.g., silica layer, may be produced by organometallic compounds such as organo-silane. A mask process may be used to maintain the first and second chip contacts 14, 15 uncovered by the metal oxide layer.

According to a second embodiment, the first conducting line 16 and the base part 17a of the second conducting line 17 may alternatively be fabricated by a process which uses a structured seed layer. Similar to the aforementioned printing or dispensing processes, this process can also be carried out as a substantially additive process in which virtually no waste material is generated. The seed material may be applied as a liquid by printing (e.g., screen printing, stencil printing or ink-jet printing) or dispensing. The first conducting line 16 and the base part 17a of the second conducting line 17 are then generated by an electroless plating process. Again, structures of one or a few μm height may be generated that way.

In these processes, the structured seed layer is generated from a liquid (i.e. ink) containing e.g., colloidal palladium or palladium ions which is deposited onto a surface such as a polymer layer on which the first conducting line 16 and the base part 17a of the second conducting line 17 are to be deposited. Prior to the application of the structured seed layer, the polymer layer may be treated chemically (for instance by applying an alcaline solution such as a zincate solution to activate the first and second chip contacts 14, 15) or physically (e.g., by applying an argon-plasma and/or oxygen/hydrogen plasma with partly chemical activation). First and second chip contacts 15, 16 made e.g., of copper may be activated by citric acid. If the first and second chip contacts 14, 15 are made of aluminum, they may be coated by zinc using a zincate activation process. In this case, it is not necessary to apply a palladium seed layer onto the first and second chip contacts 14, 15. A large area application of the zincate solution may further result in the generation of active functional groups at the surfaces (e.g., of the polymer layer) exposed to the zincate solution, which may provide for an enhanced wetability of these surfaces by the palladium solution. If silver or gold chip contacts 14, 15 are used, no activation thereof is required. The application of a seed layer on activated first and second chip contacts 14, 15 is not strictly required because such metal layers may act as seed layers themselves. Further, the palladium seed layer may be subjected to a temperature treatment using a tempering process at about 60° C. to 120° C. in order to fix it to the surface on which it is applied (e.g., the polymer layer and possibly the chip contacts 14, 15) and in order to improve the adhesion of the metallization applied to generate the first conducting line 16 and the base part 17a of the second conducting line 17.

As an alternative approach for using a printing process for applying the seed layer, a seed layer may also be generated by using a directed laser beam irradiation method (laser writing) for selectively activating the irradiated surface.

Then, a metal (typically copper or nickel) layer of e.g., about 0.5 to 3 μm thickness is deposited onto the fixed palladium seed layer. This metal layer may be applied by electroless plating, i.e. by emerging the device into an electroless metal bath. It is to be noted that the maximum thickness of the metal layer applied may be limited by the lateral resolution or pitch of the conducting lines, since short circuits should be prevented, which otherwise could occur if the thickness of the metal layer is overly increased.

Subsequently, a tempering process at about 300° C. to 400° C. may be applied in order to decrease the specific resistance of the deposited metal layer made e.g., of copper or nickel.

In contrast to mask-free processes as described above, the conducting structures 16, 17a may, according to a third embodiment, be generated by a semi-additive process using lithographic structuring techniques. In such processes, a photoresist is applied to cover all over the semiconductor chip 12 and the carrier 10. The photoresist may be structured by using exposure and development processes. Exposed areas in the structured photoresist correspond to conducting lines to be applied.

Then, a seed material such as described above (typically in liquid form) is applied to the semiconductor device in order to establish a seed layer within the removed areas of the structured photoresist. In the same way as explained above, the seed layer is then used to grow the first conducting line 16 and the base part 17a of the second conducting line 17 using an electroless plating process. In other words, the surface (e.g., of a polymer layer) exposed at the areas where the photoresist has been removed is activated, coated with a seed material as explained above and metallized by electroless metal plating as explained above. Before or after electroless plating, the photoresist is removed. This process is referred to as a semi-additive process because the photoresist used to apply the seed layer is removed in a subtractive process whereas electroless plating is a purely additive process.

Returning to FIG. 3, in a following process, the insulating layer 18 is applied over the first conducting line 16. The base part 17a of the second conducting line 17 remains uncovered.

The insulating layer 18 may be applied by various techniques. According to a first approach, the insulating layer 18 may be deposited in a structured form, e.g., by a printing or dispensing method. Similar to the application of the first conducting line 16 and the base part 17a of the second conducting line 17, the printing process may e.g., be accomplished by a screen printing process, a stencil printing process or an ink-jet printing process. Printing on vertical surfaces such as e.g., the side faces of the semiconductor chip 12 may be accomplished by tilting the device or the printing head appropriately. The material (polymer ink) to be applied is in liquid form. Thus, after printing, the applied material will be cured e.g., by applying a tempering process. For more details concerning printing the insulating layer 18, we refer to the description of the printing processes in conjunction with the application of the metallization.

Alternatively, the insulating material to be applied may be deposited to cover all over the surfaces of the semiconductor device. This may be accomplished by a dispensing, lamination, spin-coating or spray coating processes. Subsequently, the applied insulating layer is structured. For structuring, a lithographic technique or laser ablation may be employed. After structuring, the structured insulating layer 18 may be cured.

The insulating material applied in the above mentioned processes may be a liquid polymer material such as polyimide or epoxy resin. The polymer material may be unfilled or filled, i.e. a filler may be added to finely adjust the viscosity of the liquid polymer material.

With the first conducting line 16 covered by the insulating layer 18, the base part 17a of the second conducting line 17 is reinforced. Reinforcement may be accomplished by a galvanic process. To this end, the base part 17a of the second conducting line 17 may be electrically connected to the carrier 10. The semiconductor device is then immersed into a metal (e.g., copper) bath and a current is applied between an electrode in the metal bath and the carrier 10. That way, copper (or another appropriate metal) is galvanically deposited on all uncovered lines that are connected to the carrier 10 (here, by way of example, only the base part 17a of second conducting line 17 is illustrated).

The reinforcement process may be continued until the desired thickness of the second conducting line 17 is achieved. For power semiconductor devices, the thickness of the second conducting line 17 may exceed 100 μm or even 150 μm or 200 μm. That way, high current requirements may be satisfied and a high thermal conductivity is obtained. On the other hand, a thickness of less than 10 μm of the first conducting line 16 is usually sufficient for low current logic signals such as the gate control signal provided for the semiconductor chip 12.

The insulating layer 18 may be removed after the second conducting line 17 has been finished. Alternatively, as will be explained further below in more detail, the insulating layer 18 may be maintained and be utilized as a support structure for another conducting line which may be deposited onto the insulating layer 18. In other words, the insulating layer 18, which has been used in the fabrication process for generating conducting lines 16, 17 of different thickness, may further be exploited to provide for a multiple layer interconnect structure in which conducting lines may cross each other on different levels.

The semiconductor device 100 may be encapsulated in a mold material (not illustrated). The mold material may encapsulate any portion of the semiconductor device 100, but may leave the bottom surface of the carrier 10 uncovered. Various techniques may be employed to cover the components of the semiconductor device 100 with a mold material, for example compression molding or injection molding.

FIGS. 4A through 4H illustrate processes in a method of fabricating the semiconductor device 200, which is illustrated in FIG. 4H. According to FIG. 4A, a carrier 10 is arranged on a sacrificial plate 201 made e.g., of copper. The sacrificial plate 201 may be a leadframe. On this leadframe, contact pads 202, 203, 204 are placed using e.g., photo-lithographic processes. When photo-lithographic processes are used to generate the contact pads 202, 203, 204, a photoresist layer is structured to expose the sacrificial plate 201 at the areas where the contact pads 202, 203, 204 are to be generated. Alternatively, the polymer material 205 may be applied in a structured fashion onto the sacrificial plate 201. This may be accomplished by using a printing (e.g., screen, stencil or ink-jet printing) process or a dispensing process. The polymer material 205 exposes the sacrificial plate 201 at the areas where the contact pads 202, 203, 204 are to be generated. Filled or unfilled polymer materials such as polyimide or epoxy resin may be used.

In both cases, the contact pads 202, 203, 204 may be generated on the sacrificial plate 201 by a galvanic process. The contact pads 202, 203, 204 may e.g., be made from nickel and have a thin gold or silver layer on top. It is to be noted that after removing the sacrificial plate 201 (cf. FIG. 4H), the polymer material 205 may remain in between the contact pads 202, 203, 204 or may be removed and substituted by another insulating material.

Compared to other leadframe techniques, in which leads or contact pads are structured by punching or etching, the structuring method described above allows for a considerably higher packaging density, i.e. for a higher number of contact pads 202, 203, 204 for a package of given dimensions. As a difference to conventional leadframe techniques, the contact pads 202, 203, 204 may be insular, whereas in conventional leadframe technique, each contact pad or lead has to be suspended at the frame structure of the leadframe.

Further, alternatively to the carrier 10 illustrated in FIG. 4A, a carrier (not illustrated) may be used which may be pre-structured but which fails to have openings protruding through the carrier. In this case, the structuring of the carrier would be performed at the end of the fabrication process after the encapsulation of the semiconductor device 200 from the bottom side of the carrier. Such final structuring may e.g., be performed by a subtractive process using photo-lithographic and etching processes.

Returning to structured carrier 10 as depicted in FIG. 4A, semiconductor chips 12-1, 12-2 are attached to contact pads 203, 204, respectively. This process is also referred to in the art as die attach. By way of example, the semiconductor chip 12-1 may be a power integrated circuit (IC) and the semiconductor chip 12-2 may be a logic IC. These components may be attached to the contact pads 203, 204 respectively, in a electrically conductive or insulated fashion, for instance by soldering or adhesive bonding.

FIG. 4C illustrates the generation of a structured insulating layer 20. The structured insulating layer 20 may be applied to cover a zone between the power semiconductor chip 12-1 and the logic semiconductor chip 12-2 as well as to cover a zone between the power semiconductor chip 12-1 and the contact pad 202. The application of the insulating layer 20 may be accomplished according to the description related to the application of the insulating layer 18 in FIG. 3. Thus, the insulating layer 20 may either be deposited to cover the whole structure and may then be structured by photo-lithographic processes or may be applied in an additive process by using dispensing or printing techniques. To avoid reiteration, reference is made to the aforementioned description. Again, vertical structures such as side faces of the semiconductor chips 12-1, 12-2 may be printed by tilting either the carrier 10 or the printing head of the printing device.

Then, conducting lines 16 and 17a are deposited onto the semiconductor chips 12-1, 12-2 and over the contact pads 202, 203 and 204. As apparent from FIG. 4D, the conducting lines 16 and 17a are insulated against the chip pads 203, 204 by the insulating layer 20, whereas the conducting line 17a is made to be in electrical contact with the contact pad 202. Thus contact pad 202 forms a conducting line post.

The deposition process to generate the conducting lines 16 and 17a has been described earlier with reference to the first conducting line 16 and the base part 17a of the second conducting line 17 illustrated in FIGS. 1 and 3. To avoid reiteration, reference is made to this description.

As a note, an insulating layer such as polymeric insulating layer 20 used as a support structure for the first and second conducting line 16, 17a is not illustrated in FIGS. 1 to 3. However, such insulating layer may also be present in the semiconductor device 100 according to the first embodiment of the invention. As apparent for a person skilled in the art, the insulating layer 20 may possibly be omitted if the carrier 10 is not made of a conductive material. However, referring to the semiconductor device 200 of the second embodiment, as the carrier 10 is represented by (conductive) contact pads 202, 203, 204, the insulating layer 20 may be needed to guarantee an insulation between the chip pads 203, 204 at least if the chip pads 203, 204 are electrically connected to chip contacts of the semiconductor chips 12-1 and 12-2, respectively.

In a later process, the insulating layer 18 is deposited to cover the upper surface of the first conducting line 16. The first conducting line 16 may interconnect the gate of the power semiconductor chip 12-1 to a chip contact of the logic semiconductor chip 12-2. As only low currents will pass this conducting line 16, a small thickness thereof in accordance with the values outlined further above will prove sufficient. The application of the insulating layer 18 has been described in detail in relation to the first embodiment, to which reference is made in order to avoid reiteration.

In a subsequent process, the second conducting line 17a is reinforced e.g., by using galvanic methods as explained in conjunction with the first embodiment (FIGS. 1 to 3). The insulating layer 18 acts as a barrier to prevent metal (e.g., copper) to grow on the first conducting line 16. Thus, the finished second conducting line 17 is composed of a first base part 17a which is deposited before the application of the insulating layer 18 and may have substantially the same thickness as the first conducting line 16, and a second part 17b, which is deposited after the application of the insulating layer 18 and reinforces the second conducting line 17 to obtain a thickness which is substantially greater than the thickness of the first conducting line 16. As already explained, the methods to deposit the first part 17a and the second part 17b of the second conducting line 17 may be different, e.g., electroless plating and galvanic plating, respectively.

As illustrated in FIG. 4G, the semiconductor device 200 may be equipped with a mold material 206. The mold material 206, which has already been referred to before, is applied to the top side of the semiconductor device 200 leaving the bottom side of the sacrificial plate 201 uncovered. The thickness of the mold material over the highest zones of the second conducting (power) line 17 should be as small as possible in order to allow for a high thermal conductivity without, however, impairing the reliability of electrical insulation.

Then, the sacrificial plate 201 is removed e.g., by a selective chemical wet etching procedure. That way, the carrier 10 of the semiconductor device 200 is formed by the metallic contact pads 202, 203, 204 spaced apart and electrically insulated to each other by polymer material 205.

After removing the sacrificial plate 201, the bottom faces of the contact pads 202, 203, 204 may be coated by an electroless deposition of nickel and gold.

It is to be noted that the bottom side of the package of the semiconductor device 200 illustrates the contact pad locations and contact pads sizes representing the footprint of the package. Pads 202, 203 and 204 may be used either as chip pads or as posts for conducting lines. The sizes and locations of these pads may be designed in a very flexible way. By way of example, instead of using the contact pad 201 as a chip pad to mount the second semiconductor chip 12-2, the second semiconductor chip 12-2 may be omitted and the contact pad 201 may be used to serve as a post for first conducting line 16 (similar as the contact 202 serves as a post for the second conducting line 17).

FIG. 5 illustrates a semiconductor device 300 including a single semiconductor chip 12-1 according to a third embodiment. Similar components as illustrated in FIG. 4H are denoted by the same reference numerals. Again, a TSLP type package is illustrated. The semiconductor device 300 is designed in accordance with the description in conjunction to FIGS. 4A through 4H related to the semiconductor device 200. However, a third conducting line 30 has been deposited over the insulating layer 18. The deposition of the third conducting line 30 may be accomplished in the same way as the deposition of the first conducting line 16. The insulating layer 18 provides support for the third conducting line 30 and serves to insulate the first and third conducting lines 16 and 30 from each other. The third conducting line 30 may have about the same thickness as the first conducting line 16, i.e. contributes to the logic wiring of the semiconductor device 300. Alternatively, the third conducting line 30 may be implemented as a high current line similar to the second conducting line 17 and having approximately the same thickness as the second conducting line 17. First conducting line 16 and third conducting line 30 are crossing each other at different levels without being electrically interconnected.

FIG. 6 illustrates a plan view of a semiconductor device 400 which is designed according to one or more principles explained above. The semiconductor device 400 uses a leadless package, i.e. a package without pins, such as a P-TDSON (Plastic Thin Dual Small Outline Non-leaded) package or a P-VQFN (Plastic Very Thin Quad Flat Non-leaded) package. In the plan view of FIG. 6, only the outline 401 of the mold material is illustrated. A chip pad 403 (corresponding to contact pad 203 in FIGS. 4 and 5) is located at the bottom side of the semiconductor device 400. Recesses 410 at the periphery of the chip pad 403 are filled by mold material (not illustrated) to fixedly keep the mold material (not illustrated) and the chip pad 403 together.

A semiconductor chip 12-1 is mounted on the chip pad 403. Here, by way of example, the semiconductor chip 12-1 is a vertical power transistor.

A source contact (not illustrated) of the semiconductor chip 12-1 is coupled to a plane-like first conducting line 17 which may be made of copper. As it is apparent from FIG. 6, the second conducting line 17 may have a lateral dimension which approximately corresponds to the lateral dimension of the semiconductor chip 12. The second conducting line 17 extends to a contact pad 402 which corresponds to contact pad 202 in FIGS. 4 and 5. Contact pad 402 serves as a source pad and has three source terminals 402-1, 402-2 and 402-3 to which external leads may be connected at the bottom of the package.

A gate contact 14 of the semiconductor chip 12 is connected to a first conducting line 16. The first conducting line 16 extends to a contact pad 404, which corresponds to contact pad 204 illustrated in FIGS. 4 and 5. Contact pad 404 represents the gate terminal of the semiconductor device 400.

Both the first conducting line 16 and the second conducting line 17 are deposited on an insulating layer 420, which corresponds to insulating layer 20 illustrated in FIGS. 4 and 5. Thus, the first and second conducting lines 16, 17 are deposited by a planar wiring technique as described above over the insulting layer 420, thereby providing for significantly different current load capacities for the gate and source currents.

A semiconductor device 500 according to a fourth embodiment is illustrated in the plan view of FIG. 7. Semiconductor device 500 includes two power semiconductor chips 512-1, 512-2 and a logic semiconductor chip 512-3 encapsulated in a multi-chip package having the outline 501. The semiconductor device 500 includes a first chip pad 503-1 on which the first power semiconductor chip 512-1 is mounted, a second chip pad 503-2 on which the second power semiconductor chip 512-2 is mounted, a source contact pad 502 which provides three source terminals 502-1, 502-2, 502-3 of the semiconductor device 500 and four contact pads 504-1, 504-2, 504-3, 504-4 which are connected via conducting lines 516-1, 516-2, 516-3, 516-4 to chip pads on the logic semiconductor chip 512-3. The logic semiconductor chip 512-3 is mounted on the top of the first power semiconductor chip 512-1. Further, a gate contact 514-1 of the first power semiconductor chip 512-1 is connected via a conducting line 516-5 to a chip contact of the logic semiconductor chip 512-3, and a gate contact 514-2 of the second power semiconductor chip 512-2 is connected via a conducting line 516-6 to a further chip contact of the logic semiconductor chip 512-3. Both power semiconductor chips 512-1 and 512-2 are vertical power transistors. A bottom drain contact of the first semiconductor chip 512-1 is connected to the first chip pad 503-1. A top source contact 515-1 of the first power semiconductor chip 512-1 is connected via conducting line 517-1 to the second chip pad 503-2. The second chip pad 503-2 is electrically connected to a bottom drain contact of the second semiconductor chip 512-2, and a source contact 515-2 thereof is electrically connected via a conducting line 517-2 to the source contact pad 502. A person skilled in the art will appreciate that the two power semiconductor chips 512-1 and 512-2 are connected in a half-bridge configuration in which the drain contact of the high side transistor 512-2 is coupled to the source contact of the low side transistor 512-1. The logic semiconductor circuit 512-3 is configured to control the power semiconductor chips 512-1 and 512-2.

The wiring of the semiconductor device 500 is generated and designed in line with the description in conjunction with FIGS. 1 to 6. More specifically, the conducting lines 516-1, 516-2, 516-3, 516-4, 516-5, 516-6 are designed as low current lines having a thickness as indicated earlier, e.g., of less than 10 μm. The conducting lines 517-1 and 517-2 are high current conducting lines having a thickness as indicated earlier, e.g., of more than 100 μm. These conducting lines are generated by exploiting one or more of the planar deposition methods as explained above, using e.g., an isolating foil 520 as a support member during deposition. Isolating foil 520 corresponds to the isolating layer 20 depicted in FIGS. 4, 5 and to the isolating layer 420 depicted in FIG. 6.

It is to be noted that the semiconductor device 500 may be modified to a variety of configurations. By way of example, the logic semiconductor chip 512-3 may be situated next to the power semiconductor chips 512-1, 512-2 rather than on top thereof. Further, additional components such as passive components or additional semiconductor chips may be added.

Figure 8:
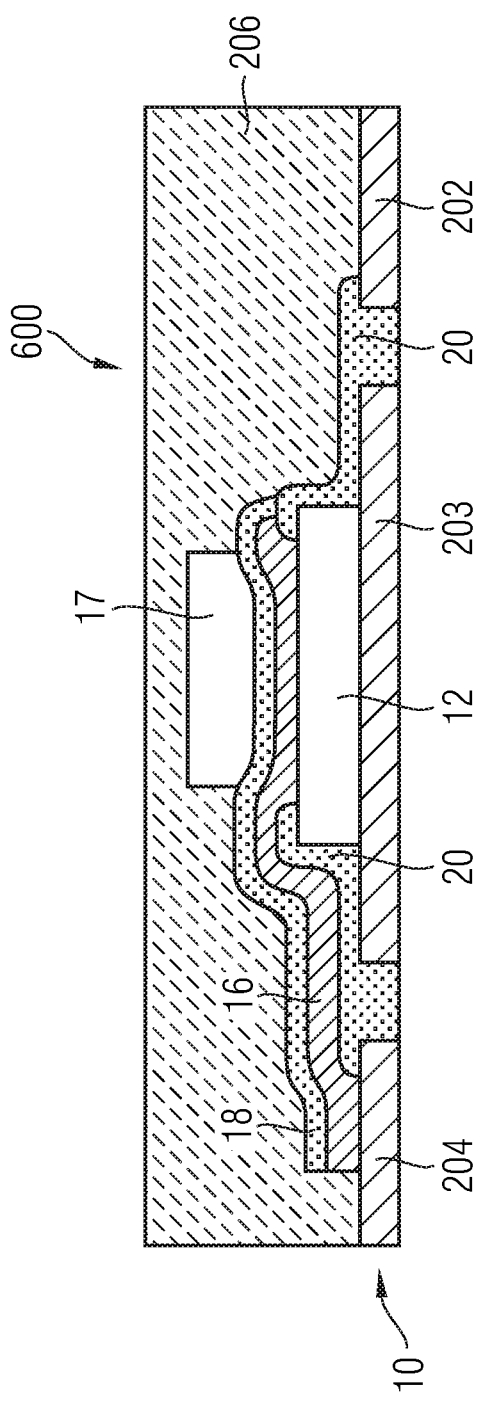
FIG. 8 illustrates a cross-sectional view of a semiconductor device according to a sixth exemplary embodiment.

Moreover, semiconductor devices according to the described and other embodiments may include a multiple layer wiring, in which conducting lines of small thickness, conducting lines of small and thick thickness as well as conducting lines of thick thickness cross each other without being electrically interconnected. FIG. 8 illustrates a cross-sectional view of a semiconductor device 600 according to a sixth embodiment. The semiconductor device 600 largely corresponds to the semiconductor device 300 illustrated in FIG. 5. In particular, the semiconductor device 600 also includes a multi-layer wiring having two conducting lines 16, 17 separated by an insulating layer 18 and crossing each other at different levels. Different to the semiconductor device 300, the multi-layer wiring involves a thin first conducting line 16 and a thick second conducting line 17. It is to be noted that similar to semiconductor device 300, the insulating layer 18 may provide support for another thin conducting line (not illustrated) as referred to in FIG. 5 by the reference numeral 30. The semiconductor chip 12 may be of any type, e.g., may be a logic semiconductor chip, a power semiconductor chip etc.

Figure 9:
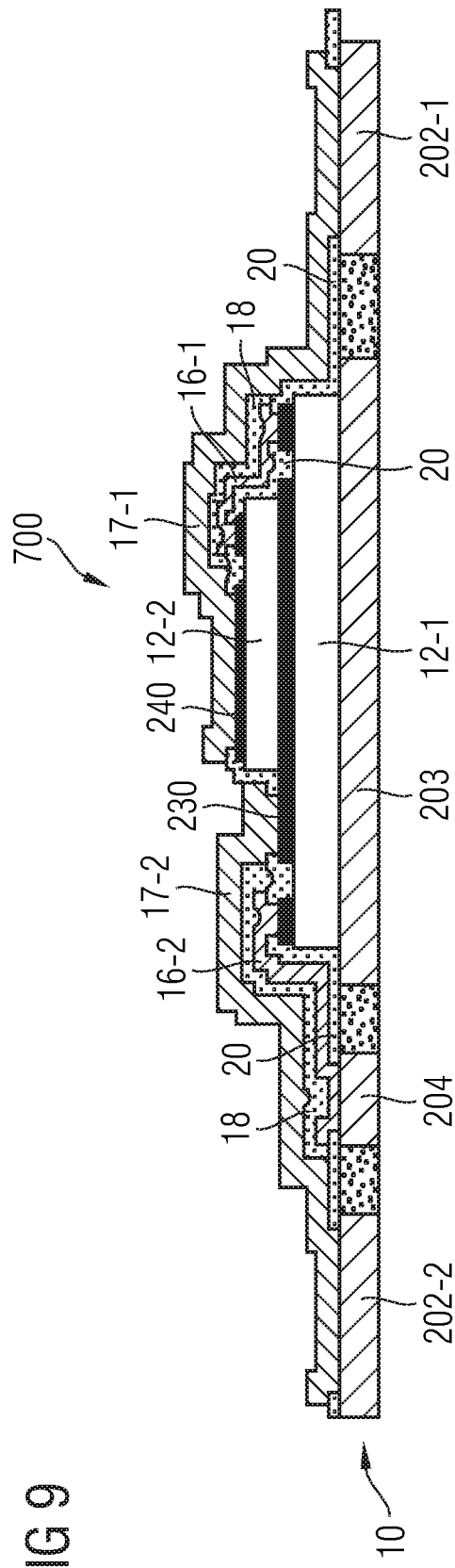
FIG. 9 illustrates a schematic cross-sectional view of semiconductor device according to a seventh exemplary embodiment.

FIG. 9 illustrates a sectional view of a semiconductor device 700 as a seventh embodiment. The semiconductor device 700 represents a multi-chip semiconductor device in which two semiconductor chips 12-1, 12-2 are arranged in a stacked configuration. By way of example, a power-on-logic configuration is illustrated in which the power semiconductor chip 12-2 is mounted on the logic semiconductor chip 12-1. In this configuration, the logic semiconductor chip 12-1 is mounted on the contact pad 203 as a bottom-chip. The top surface of the first semiconductor chip 12-1 is provided with a metallization 230 which may be made of copper and may have a thickness of one or several μm. The power semiconductor chip 12-2 is attached e.g., by soldering on the metallization 230, wherein the metallization 230 is used as the drain contact of the power semiconductor chip 12-2. This power semiconductor chip 12-2, also referred to as the top-chip, is provided with a metallization 240 extending at the top surface thereof. This metallization 240 serves as a source contact of the power semiconductor chip 12-2.

In the following, the internal wiring of the semiconductor device 700 will be explained in more detail. Again, reference is made to the embodiments described above in view of the design and manufacturing of conducting lines of the wiring. Here, a wiring having essentially two planes of conducting lines is used. The lower conducting line plane includes conducting lines 16-1 and 16-2 which are arranged between a lower insulating layer 20 and an upper insulating layer 18. The conducting line 16-1 extends from a chip contact of the logic semiconductor chip 12-1 to a gate chip contact of the power semiconductor chip 12-2. The conducting line 16-2 extends from a contact pad 204 representing an external terminal of the semiconductor device 700 to a chip contact on the logic semiconductor chip 12-1. Both conducting lines 16-1 and 16-2 are of small thickness in terms of the above description.

The upper insulating layer 18 serves as a support for two conducting lines 17-1, 17-2 arranged in the upper conducting line wiring plane of the semiconductor device 700. More specifically, a conducting line 17-1 may connect the source metallization 240 of the power semiconductor chip 12-2 to a contact pad 202-1 at the bottom of the semiconductor device 700. Conducting line 17-2 is made to connect a contact pad 202-2 at the bottom of the semiconductor device 700 to the metallization 230 forming the drain contact of the power semiconductor chip 12-2. Both second conducting lines 17-1, 17-2 are configured to have a greater thickness than the first conducting lines 16-1, 16-2 in accordance with the description of first and second conducting lines 16, 17 in the aforementioned embodiments. More than two planes of conducting lines may be provided, for instance, there may be provided a second plane including thin conducting lines (not illustrated) used for routing logical signals.

It is to be noted that heat generated in the power semiconductor chip 12-2 is transferred through the first semiconductor chip 12-1 and the bottom contact pad 203 to an application board (not illustrated) and may also be transferred via the large area and large thickness conducting line 17-1 to a heat sink (not illustrated) placed in the vicinity of the top of the semiconductor device 700 as well as to contact pad 202-1 which is connected to the second conducting line 17-1. Similar to devices illustrated in FIGS. 4, 5 and 8, the semiconductor device 700 may be encapsulated in a molding material (not illustrated).

Further, the metal carrier 10 as illustrated in FIGS. 4, 5, 8 and 9 may be generated in a process in which the semiconductor chips 12, 12-1, 12-2 are applied on a continuous metal layer and structuring of the carrier 10 is carried out later on in the manufacturing process (e.g., before or after generation of the conductive lines 16, 17 or even after application of the mold material 206). In these cases, no sacrificial plate 201 is needed and the polymer material 205 between the carrier pads may be applied after structuring the carrier 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a carrier;
    a semiconductor chip having side faces extending between a top surface and a bottom surface, the bottom surface attached to the carrier;
    a structured insulating layer disposed directly on the side faces, the top surface, and a surface of the carrier leaving contacts on the top surface of the semiconductor chip and contact pads on the carrier exposed;
    a first conducting line having a first thickness;
    a second conducting line having a second thickness; wherein the first thickness is smaller than the second thickness, and wherein the first and second conducting lines are disposed on the structured insulating layer and extend between contacts on the top surface of the semiconductor chip and contact pads on the carrier;
    a housing of the semiconductor device comprising a mold material encapsulating the semiconductor chip, the structured insulating layer, and the first and second conducting lines; and
    an insulating barrier covering the first conducting line, exposing the second conducting line and being encapsulated by the mold material of the housing.

2. The semiconductor device of claim 1, further comprising:
    a third conducting line deposited over the insulating barrier.

3. The semiconductor device of claim 1, comprising wherein the carrier is of a TSLP type.

4. The semiconductor device of claim 1, comprising wherein the carrier is made of an insulating material.

5. The semiconductor device of claim 1, further comprising:
    a mold material encapsulating the semiconductor chip and the first and second conducting lines.

6. The semiconductor device of claim 1, wherein the first deposited conducting line and the second deposited conducting line are plated metal layers.

7. The semiconductor device of claim 1, wherein the second conducting line is composed of a base part having substantially the first thickness and a reinforcement part disposed on the based part to obtain the second thickness.

8. The semiconductor device of claim 7, wherein the first conducting line and the base part of the second conducting line are made of sintered metal particles.

9. The semiconductor device of claim 8, wherein the reinforcement part of the second conducting line is made of a galvanically deposited metal.

10. A semiconductor device comprising:
    a carrier made of metal;
    a semiconductor chip having side faces extending between a top surface and a bottom surface, the bottom surface attached to the carrier;
    a structured insulating layer disposed directly on the side faces, the top surface, and a surface of the carrier leaving contacts on the top surface of the semiconductor chip and contact pads on the carrier exposed;
    a first conducting line disposed directly on the structured insulating layer and extending between a contact on the top surface of the semiconductor chip and a contact pad on the carrier, the first conducting line being disposed directly on at least one contact on the surface of the semiconductor chip and directly on surfaces of the semiconductor chip other than the at least one contact;
    an insulating layer applied over the first deposited conducting line;
    a second conducting line deposited over the insulating layer; and
    a housing of the semiconductor device comprising a mold material encapsulating the semiconductor chip, the structured insulating layer, the first and second conducting lines, and the insulating layer, wherein a thickness of the second conducting line is greater than a thickness of the first conducting line.

* * * * *